Oct. 16, 1962 J. E. BERRY 3,058,440

CIRCUIT MODULE REWORKING FIXTURE

Filed Aug. 3, 1959 2 Sheets-Sheet 1

INVENTOR.
JOHN E. BERRY,
BY
Donald L. Royer
AGENT.

Oct. 16, 1962 J. E. BERRY 3,058,440

CIRCUIT MODULE REWORKING FIXTURE

Filed Aug. 3, 1959 2 Sheets-Sheet 2

INVENTOR.
JOHN E. BERRY,
BY Donald L. Royer
AGENT.

United States Patent Office 3,058,440

Patented Oct. 16, 1962

3,058,440

CIRCUIT MODULE REWORKING FIXTURE

John E. Berry, Sherman Oaks, Calif., assignor to Hughes Aircraft Company, Culver City, Calif., a corporation of Delaware Filed Aug. 3, 1959, Ser. No. 831,184
3 Claims. (Cl. 113—99)

The present invention relates generally to a circuit module reworking fixture and relates more particularly to a manually used fixture for separating and for reassembling components of a cordwood type of electronic module, thus to enable replacement, changes or additions of electrical or electronic components forming a portion of the module.

In order to provide for increased component density in electronic apparatus, an assembly technique of apparatus, commonly known as a cordwood type module, is in use. Modules of this type include a pair of spaced, parallel printed circuit boards having a plurality of electrical components such as resistors, capacitors, diodes and the like mounted therebetween. These components are of the axial leaded type with the leads thereof extending through suitable openings in the circuit boards and attached, as by soldering, to various portions of the printed circuits carried by the circuit boards. The components are disposed generally normal to the circuit boards and arranged in a cordwood fashion in both vertical and horizontal rows. Through this method of assembling these components and the interconnecting circuits therefor, a greater component density may be obtained than when such components are mounted directly on flat printed circuit boards or assembled on a typical chassis utilizing separate wires for the desired interconnections.

It is often necessary, due to errors in original assembly; the necessity for replacement of faulty components; or in making changes in the modules of this type, to dissasemble the module in order to provide access to one or more components that would otherwise be inaccessible. It is, of course, possible to remove certain components from between the circuit boards and that may be disposed adjacent the edges thereof; however, due to the disposition of the leads through both circuit boards, extreme difficulty is experienced in aligning and inserting a new component. Additionally, when a cordwood module of this type is disassembled, it is difficult to remove the leads from all components, and especially in a simultaneous manner, without moving the components from their original locations. In the event such components and the leads therof are moved or bent, it is also extremely difficult to replace a removed circuit board following correction or repair of individual components therein.

The apparatus of the present invention is therefore intended for use in connection with cordwood type electronic modules and to enable both dissassembly and reassembly of the module and removal of one of the printed circuit boards thereof while leaving the components disposed therebetween in their original locations. Following removal of one of the circuit boards, it is then a relatively simple matter to remove, replace or repair one or more of the components of the module.

It is therefore one important object of the present invention to provide an apparatus for enabling disassembly and reassembly of cordwood types of electronic modules.

Another object of the invention is to provide a cordwood module reworking fixture having means for supporting the module and enabling removal of one of the circuit boards forming a portion thereof.

Still another important object of the invention is to provide a cordwood type electronic module reworking apparatus that is simple in construction, reliable and effective in use, and which may be used by comparatively inexperienced personnel.

Other and further important objects of the invention will become apparent from the disclosures in the following detailed specification, appended claims and accompanying drawings, wherein:

Figure 1:
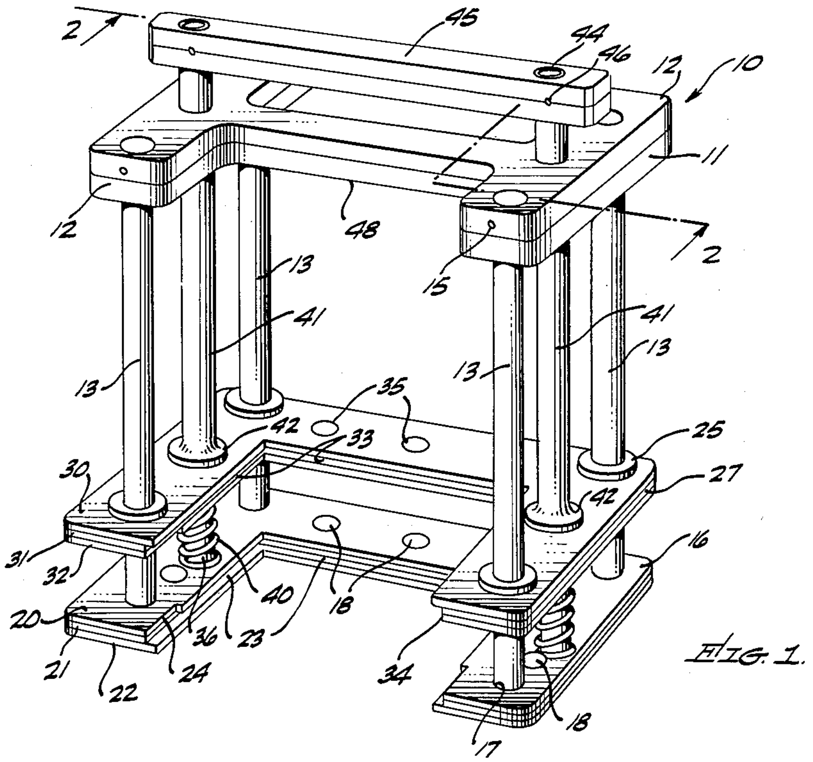
FIGURE 1 is a perspective view showing the module reworking fixture of the present invention.

With reference to the drawings, the module reworking fixture of this invention is shown as indicated generally at 10. The fixture includes an I-shaped frame member 11, having laterally extending portions 12. The member 11 may be made from any suitable material and preferably from a low thermally conductive material. As shown, a plurality of guide rods 13 are carried by the laterally extending portions 12 of the frame member 11 and are retained in openings 14 by means of set screws 15. The rods 13 have lower ends secured to a stationary board supporting structure 16. The lower ends of the rods 13 engage an upper surface of the stationary support 16 and are secured to position by means of screws 17 extending through the support 16.

The stationary support 16 is made from a plurality of sheets of material that are generally U-shaped and secured together by means of rivets 18. The sheets of material are indicated at 20, 21 and 22. The sheets 20, 21 and 22 are substantially identical in shape, with the sheets 20 and 22 being slightly wider than the sheet 21, whereby to define a groove 23. The sheet 20 is also notched as at 24.

As shown, the rods 13 are also slidably disposed through flanged bushings 25 that are carried in suitable openings 26 in a movable support structure 27. The support structure 27 comprises a plurality of sheets of material 30, 31 and 32 that are similar to the sheets 20, 21 and 22 of the stationary support 16. The wider nature of the sheets 30 and 32 serves to define a groove 33, with the sheet 32 being notched as at 34. The sheets 30, 31 and 32 are secured together by means of suitable rivets 35.

Figure 2:
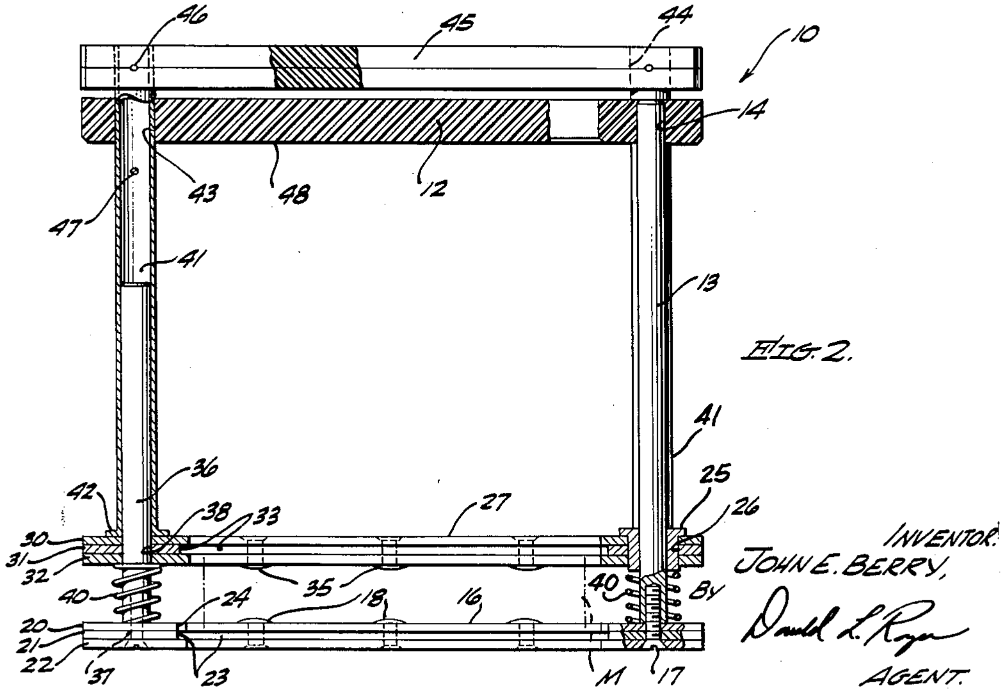
FIG. 2 is a transverse view, partially in section, through the reworking fixture, as taken substantially as indicated by line 2—2, FIG. 1.

As shown primarily in FIG. 2, a pair of alignment rods 36 are carried by the stationary support structure 16 and extend upwardly therefrom. The alignment rods 36 are secured to the stationary support 16 by means of screws 37. The alignment rods 36 slidably extend through suitable openings 38 in the movable support 27 there being compression springs 40 disposed about the rods 36 and intermediate opposed surfaces of the stationary and movable supports 16 and 27. The alignment rods 36 are adapted for slidable reception in tubular push rods 41. The lower ends of the push rods 41 are flanged as at 42 and adapted for disposition against an upper surface of the movable support 27. Upper end portions of the push rods 41 slidably extend through suitable openings 43 in the frame structure 12 and into openings 44 in a handle 45. The rods 44 are secured to the handle by means of suitable set screws 46. The handle 45, like the frame structure 12, is preferably made from a thermally nonconductive material.

It may thus be seen that the compression springs 40 serve to bias the movable support 27 in a direction away from the stationary support 16 and to move the push rods 41 together with the handle 45 in an upwardly direction. Movement in this direction is limited by means of transversely disposed pins 47 extending through and laterally from the push rods 41 and adapted for engagement with a lower surface 48 of the frame member 12.

For a purpose to be hereinafter more fully described, the various U-shaped sheets of material 20, 21, 22, 30, 31 and 32, together with other components connected thereto, are all made from stainless steel or other similar material to which solder will not readily adhere.

Figures 3, 4, 5:
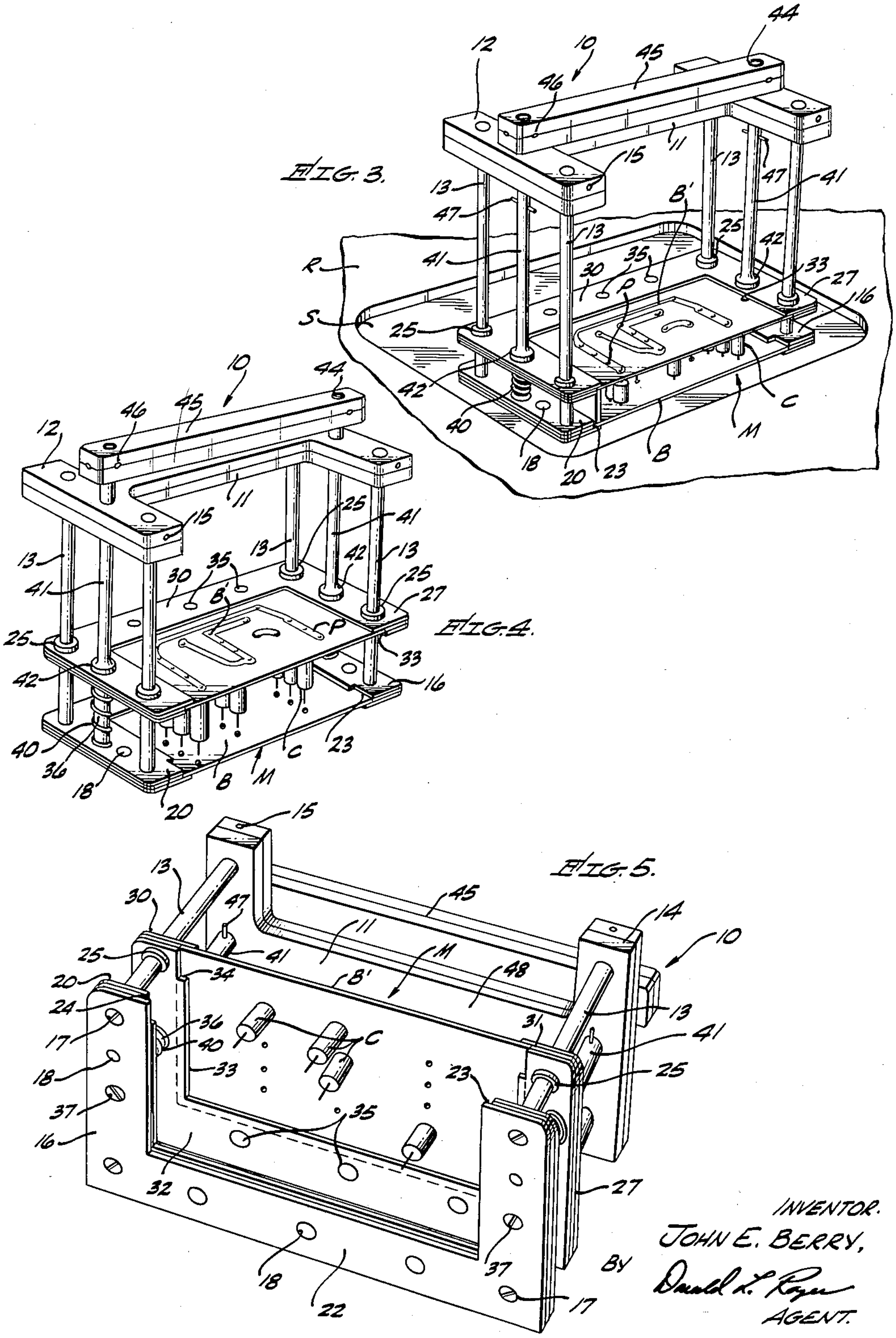
FIG. 3 is a perspective view on a reduced scale showing the present reworking fixture in association with a cordwood type electronic module and during one stage of the use thereof.
FIG. 4 is a perspective view similar to FIG. 3 showing the present fixture and module in another stage of the use thereof.
FIG. 5 is a perspective view showing the present reworking fixture with the cordwood module having one of the circuit boards removed.

In use of the present module reworking fixture, and referring to primarily FIG. 3, the handle 45, together with the central portion of the frame structure 12, is manually grasped and moved together hereby to move the movable support 27 in opposition to the force of the compression springs 40 and toward the stationary support 16. Thereafter, a cordwood type module, indicated generally at M, is disposed with edge portions of circuit boards B and B′ disposed respectively in the grooves 23 and 33 in the stationary and movable supports 16 and 27. As shown, the module M has a plurality of axially leaded components C disposed therebetween with the leads of the components extending through suitable openings in the boards B and B′ and secured to printed circuits P on these circuit boards as by soldering. Thus, when the module M is disposed in the present reworking fixture, a force is applied to the boards B and B′ in a direction toward separation of these boards, this force being distributed about three edges of the boards due to the disposition of such edges in the grooves 23 and 33.

The reworking fixture will thus appear as illustrated in FIG. 3, with the next step in removing one of the circuit boards being to dip the exposed lower surface of the board B in molten solder, indicated at S, and retained in a suitable receptacle R. The molten solder S is maintained at a temperature of from 460°–480° F., and approximately 5 seconds is required to heat and melt the solder securing the leads of the components C to the printed circuit carried by the board B. The spring bias on the boards B and B′ thereby acts to move the upper board B′ and the components C carried thereby away from the board B, simultaneously withdrawing the lower end of the leads of the components C from the openings in the board B. The reworking fixture of the cordwood module M will at this time appear as indicated in FIG. 4. Inasmuch as both the frame 11 and the handle 45 are made from thermally nonconductive material, the fixture may be handled thereby, even though generally heated by the solder.

Following separation of the board B from the other elements and components of the circuit module, the board B may be removed by laterally sliding from the groove 23, thus to present the module and reworking structure as indicated in FIG. 5. It may be seen that the various components C are now readily accessible and may be individually removed, replaced or repaired.

When one or more of the components C are removed and new components inserted, the leads of the new components are disposed parallel to the leads of the other components, and the leads thereof associated with the circuit board B′ are soldered in place. Thereafter, either a new circuit board B, or the originally removed board is replaced in the groove 23, and the handle 45 is operated hereby again to dispose the leads into the openings in the board B. While held in this position, the lower surface of the board B may again be dipped in the solder bath, removed and held in position until the solder sets, hereby again to reassemble the repaired or reworked circuit module.

It may thus be seen that the present module reworking fixture enables repair or service to cordwood type electronic modules with a minimum of time and ease, and that the modules may be disassembled and reassembled without damage to, movement of or interference by the satisfactory components of the module.

Having thus described the invention and the present embodiment thereof, it is desired to emphasize the fact that many modifications may be resorted to in a manner limited only by a just interpretation of the following claims.

I claim:

1. In an apparatus for disassembling circuit modules of the type having a pair of spaced parallel circuit boards and axially leaded electronic components disposed between said boards and solderably secured thereto, said apparatus comprising, in combination: a frame structure; a U-shaped stationary support carried by said frame structure; a U-shaped movable support carried by said frame structure and oriented similar to said stationary support, said stationary and movable supports being disposed in parallel relationship; groove means in each of said supports, said groove means being inwardly directed along inside three edges of said U-shaped supports and adapted for individual engagement with each of said pair of circuit boards; spring means disposed between the opposed surfaces of said stationary support and said movable support for biasing said supports and said circuit boards carried thereby laterally away from each other; and means slidably mounted on said frame structure and connected with said movable support for moving said movable support against said biasing means, one of said circuit boards being adapted for disposition of a surface thereof in a heated medium whereby to melt solder connections between leads of said components and said one of said circuit boards and to effect removal of said one of said boards from said leads by said biasing means.

2. In an apparatus for disassembling circuit modules of the type having a pair of spaced parallel circuit boards and axially leaded electronic components disposed between said boards and solderably secured thereto, said apparatus comprising, in combination: an I-shaped frame structure; a plurality of rods carried by corner portions of said frame structure; a U-shaped stationary support carried by said rods; a U-shaped movable support slidably mounted on said rods and oriented similar to said stationary support, said stationary and movable supports being disposed in parallel relationship; groove means in each of said supports, said groove means being inwardly directed along inside three edges of said U-shaped supports and adapted for individual engagement with edges of each of said pair of circuit boards; compression spring means disposed between opposed surfaces of said supports for biasing said supports and said circuit boards carried thereby laterally away from each other; and push rod means slidably disposed through said frame structure for moving said movable support against said biasing means, one of said circuit boards being adapted for disposition of a surface thereof in a heated medium whereby to melt solder connections between leads of said components and said one of said circuit boards and to effect removal of said one of said boards from said leads by said biasing means.

3. In an apparatus for disassembling circuit modules of the type having a pair of spaced parallel circuit boards and axially leaded electronic components disposed between said boards and solderably secured thereto, said apparatus comprising, in combination: an I-shaped frame structure; a plurality of guide rods carried by corner portions of said frame structure; a laminated U-shaped stationary support carried by said guide rods; a laminated, U-shaped movable support slidably mounted on said rods and oriented similar to said stationary support, said stationary and movable supports being disposed in spaced parallel relationship; three sided grooves defined between laminates and along three inside edges of said supports, said grooves being adapted for individual engagement with respective three edges of each of said pair of circuit boards; compression springs disposed between opposed surfaces of said supports for biasing said supports and said circuit boards carried thereby laterally away from each other; means including a handle and push rods slidably disposed through said I-shaped frame structure for moving said movable support against said biasing means; and means for limiting movement of said movable support relative to said stationary support, one of said circuit boards being adapted for disposition of a surface thereof in a heated medium whereby to melt solder connections between leads of said components and said one of said circuit boards and to effect removal of said one of said boards from said leads by said biasing means.

References Cited in the file of this patent

UNITED STATES PATENTS

| | | |
|---|---|---|
| 2,207,892 | Mullaney | July 16, 1940 |
| 2,853,772 | Yuter | Sept. 30, 1958 |
| 2,906,013 | Kass | Sept. 29, 1959 |